(12) United States Patent
Klauser et al.

(10) Patent No.: US 7,861,650 B2
(45) Date of Patent: Jan. 4, 2011

(54) METHOD AND APPARATUS FOR ADJUSTING A SUBSTRATE SUPPORT

(75) Inventors: John G. Klauser, Holliston, MA (US); Ronald J. Forget, Douglas, MA (US)

(73) Assignee: Illinois Tool Works, Inc., Glenview, IL (US)

( * ) Notice: Subject to any disclaimer, the term of this patent is extended or adjusted under 35 U.S.C. 154(b) by 778 days.

(21) Appl. No.: 11/786,910

(22) Filed: Apr. 13, 2007

(65) Prior Publication Data

US 2008/0250951 A1   Oct. 16, 2008

(51) Int. Cl.
   *B05C 17/08*   (2006.01)

(52) U.S. Cl. ........................... 101/126; 101/128

(58) Field of Classification Search .............. 101/126, 101/128

See application file for complete search history.

(56) References Cited

U.S. PATENT DOCUMENTS

| | | | |
|---|---|---|---|
| 3,950,095 A * | 4/1976 | Bouygues et al. ............ 355/72 |
| 4,676,649 A * | 6/1987 | Phillips .................... 356/401 |
| 4,864,361 A * | 9/1989 | Amao et al. ................ 355/53 |
| 5,060,063 A | 10/1991 | Freeman |
| 5,157,438 A | 10/1992 | Beale |
| RE34,615 E | 5/1994 | Freeman |
| 5,752,446 A | 5/1998 | Squibb |
| 5,897,108 A | 4/1999 | Gordon et al. |
| 5,901,646 A * | 5/1999 | Walker et al. .............. 101/123 |
| 5,943,089 A | 8/1999 | Douglas |
| 6,397,742 B1 * | 6/2002 | Proctor et al. ............. 101/124 |
| 6,621,517 B1 | 9/2003 | Squibb |
| 6,663,712 B2 * | 12/2003 | Doyle et al. ............... 118/301 |
| 6,738,505 B1 | 5/2004 | Prince |
| 6,810,138 B1 | 10/2004 | Schanz |
| 6,820,545 B2 * | 11/2004 | Yamasaki et al. ........... 101/123 |
| 6,891,967 B2 | 5/2005 | Prince |

(Continued)

FOREIGN PATENT DOCUMENTS

EP   0 259 776 B1   3/1988

(Continued)

OTHER PUBLICATIONS

EKRA-EVA tm Vision-System; http://www.ekra.com/pages/eva.html; 1 pg.

(Continued)

*Primary Examiner*—Anthony H. Nguyen
(74) *Attorney, Agent, or Firm*—Lando & Anastasi, LLP

(57) ABSTRACT

A stencil printer for printing viscous material on a substrate includes a frame, a stencil, and a print head to deposit and print viscous material over the stencil. A substrate support supports a substrate in a print position. A substrate support movement assembly includes a first movement mechanism configured to move the substrate support in a first direction, a second movement mechanism configured to move the substrate support in a second direction, the second direction being generally perpendicular to the first direction, and a third movement mechanism, spaced from a first movement mechanism, configured to move the substrate in the first direction. The stencil printer further includes a controller coupled to the substrate support movement assembly to move the substrate support by the first, second and third movement mechanisms in an x-direction, a y-direction and a rotational direction to align the substrate.

11 Claims, 12 Drawing Sheets

U.S. PATENT DOCUMENTS

| | | |
|---|---|---|
| 7,028,391 B2 | 4/2006 | Pham-Van-Diep et al. |
| 7,121,199 B2 | 10/2006 | Perault et al. |
| 2004/0142099 A1* | 7/2004 | Rossmeisl et al. ............. 427/96 |
| 2007/0102477 A1 | 5/2007 | Prince |
| 2007/0175343 A1 | 8/2007 | Prince |

FOREIGN PATENT DOCUMENTS

| | | |
|---|---|---|
| GB | 2 403 003 A | 12/2004 |
| WO | 01 63988 A1 | 8/2001 |

OTHER PUBLICATIONS

Patent Abstracts of Japan; JP 2002234131 A(Sony Corp.); Aug. 20, 2002; 1 pg.

International Search Report for PCT/US2006/043166 mailed Feb. 2, 2007.

International Search for PCT/US2008/056935 mailed Jun. 27, 2008.

* cited by examiner

METHOD AND APPARATUS FOR ADJUSTING A SUBSTRATE SUPPORT

BACKGROUND OF INVENTION

1. Field of Invention

The invention relates generally to substrate support assemblies and methods for supporting and stabilizing a substrate within a machine that performs an operation on the substrate, and more particularly to a substrate adjustment assembly of a stencil printer particularly designed to adjust the position of the substrate during a print operation.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials, is used to align the circuit board with the stencil or screen of the stencil printer prior to the printing of solder paste onto the circuit board. The fiducials serve as reference points when aligning a circuit board to the stencil. Once a circuit board has been aligned with the stencil in the printer, the circuit board is raised to the stencil by a substrate support, e.g., a table having pins, and fixed with respect to the stencil. Solder paste is then dispensed onto the stencil, and a wiper blade or squeegee traverses the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard cartridge. After the print operation, the board is then released, lowered away from the stencil, and transported to another station within the printed circuit board fabrication line.

As referenced above, the stencil and the circuit board are aligned to accurately print solder paste precisely on the pads of the circuit board. In one known stencil printer, the substrate support is connected to spring-loaded actuators to control the x-axis movement, the y-axis movement and the theta or rotational movement of the substrate support. To achieve alignment of the substrate and the stencil, the spring-loaded actuators are manipulated to control the movement of the substrate support.

SUMMARY OF INVENTION

Embodiments of the invention provide improvements to stencil support assemblies, such as those described above.

Aspects of the invention are directed to a stencil printer for printing viscous material on a substrate. In certain embodiments, the stencil printer comprises a frame, a stencil coupled to the frame, and a print head, coupled to the frame, to deposit and print viscous material over the stencil. The stencil printer further comprises a substrate support coupled to the frame to support a substrate in a print position and a substrate support movement assembly coupled to the substrate support. The substrate support movement assembly comprises a first movement mechanism configured to move the substrate support in a first direction, a second movement mechanism configured to move the substrate support in a second direction, the second direction being generally perpendicular to the first direction, and a third movement mechanism, spaced from a first movement mechanism, configured to move the substrate in the first direction. The stencil printer further comprises a controller coupled to the substrate support movement assembly to move the substrate support by the first, second and third movement mechanisms in an x-direction, a y-direction and a rotational direction to align the substrate.

Embodiments of the stencil printer may include achieving y-direction of movement by adjusting the first and third movement mechanisms, x-direction of movement by adjusting the second movement mechanism and rotational direction of movement by adjusting the first and third movement mechanisms in opposite directions. Each of the first, second and third movement mechanisms may comprise a ball screw drive assembly having a threaded shaft and a ball screw member axially movable along a length of the threaded shaft, the ball screw member being coupled to the substrate support. The substrate support movement assembly may further comprise a drive coupled to the threaded shaft, the drive being configured to rotate the threaded shaft under the control of the controller. The ball screw member of the substrate support movement assembly may include a linear bearing.

Another aspect of the invention is directed to a substrate support assembly comprising a frame, a substrate support coupled to the frame to support a substrate in a print position, and a substrate support movement assembly. In one embodiment, the substrate support movement assembly comprises a first movement mechanism configured to move the substrate support in a first direction, a second movement mechanism configured to move the substrate support in a second direction, the second direction being generally perpendicular to the first direction, and a third movement mechanism, spaced from a first movement mechanism, configured to move the substrate in the first direction. The substrate support movement assembly is capable of moving the substrate support by the first, second and third movement mechanisms in an x-direction, a y-direction and a rotational direction.

Embodiments of the substrate support assembly may include achieving y-direction of movement by adjusting the first and third movement mechanisms in the same direction, x-direction of movement by adjusting the second movement mechanism, and rotational direction of movement by adjusting the first and third movement mechanisms in opposite directions. Each of the first, second and third movement mechanisms may comprise a ball screw drive assembly having a threaded shaft and a ball screw member axially movable along a length of the threaded shaft, the ball screw member being coupled to the substrate support. The substrate support movement assembly may further comprise a drive coupled to the threaded shaft, the drive being configured to rotate the threaded shaft under the control of the controller. The ball screw member of the substrate support movement assembly may include a linear bearing.

Another aspect of the invention is directed to a method for dispensing solder paste onto a substrate. In a certain embodiment, the method comprises delivering a substrate to a substrate support of a stencil printer; manipulating the substrate support so as to orient the substrate in a print position, the manipulating the substrate support being achieved by moving the substrate support in a first direction and moving the substrate support in a second direction; and performing a print operation to print solder paste onto the pads of the substrate.

Embodiments of the method may include capturing an image of at least one fiducial disposed on the substrate. Manipulating the substrate support may be based on the image of the at least one fiducial. Manipulating the substrate support may be achieved by a substrate support movement assembly comprising a first movement mechanism configured to move the substrate support in a first direction, a second movement mechanism configured to move the substrate support in a second direction, the second direction being generally perpendicular to the first direction, and a third movement mechanism configured to move the substrate in the first direction. The substrate support movement assembly may move the substrate support by the first, second and third movement mechanisms in an x-direction, a y-direction and a rotational direction. The method may further comprise positioning a stencil onto the substrate when performing the print operation.

Yet another aspect of the invention is directed to an apparatus for performing a dispense operation on a substrate. In one embodiment, the apparatus comprises a frame, a dispenser coupled to the frame, the dispenser being configured to dispense viscous material on the substrate, a substrate support coupled to the frame to support a substrate in a print position, a substrate support movement assembly, coupled to the substrate support. The substrate support movement assembly comprises a first movement mechanism configured to move the substrate support in a first direction, a second movement mechanism configured to move the substrate support in a second direction, the second direction being generally perpendicular to the first direction, and a third movement mechanism spaced from the first movement mechanism and configured to move the substrate support in the first direction. An imaging system is coupled to the frame to view the substrate in the print position. The apparatus further comprises a controller coupled to the substrate support movement assembly and the imaging system to move the substrate support by the first, second and third movement mechanisms in an x-direction, a y-direction and a rotational direction to align the substrate.

Embodiments of the apparatus may include achieving y-direction of movement by adjusting the first and third movement mechanisms, x-direction of movement by adjusting the second movement mechanism, and rotational direction of movement by adjusting the first and third movement mechanisms in opposite directions. Each of the first, second and third movement mechanisms may comprise a ball screw drive assembly having a threaded shaft and a ball screw member axially movable along a length of the threaded shaft, the ball screw member being coupled to the substrate support. The substrate support movement assembly may further comprise a drive coupled to the threaded shaft, the drive being configured to rotate the threaded shaft under the control of the controller. The ball screw member of the substrate support movement assembly may include a linear bearing.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
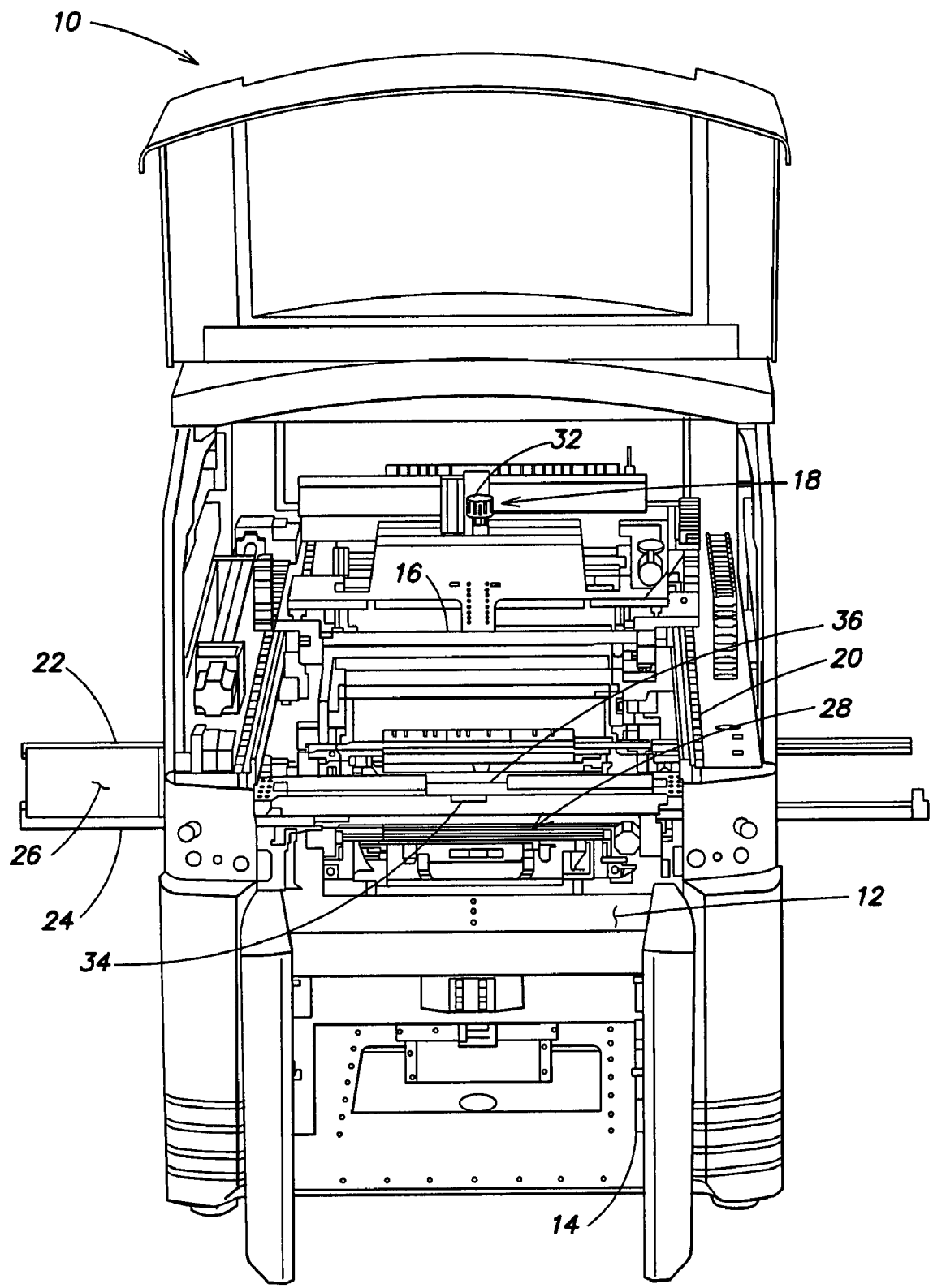
FIG. 1 shows a front perspective view of a stencil printer of an embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the invention will now be described with reference to a stencil printer used to print solder paste onto a printed circuit board. One skilled in the art will appreciate, however, that embodiments of the invention are not limited to stencil printers that print solder paste onto circuit boards, but rather, may be used in other applications requiring dispensing of other viscous materials, such as glues and encapsulants. For example, embodiments of the invention can also be used in dispensers, reflow ovens, wave solder machines, and pick and place machines, or any other apparatus used to secure a component to an electronic substrate (e.g., a printed circuit board) during a work operation. Indeed, embodiments of the invention may be used in any mechanism where two parts or assemblies must be accurately aligned with one another. Further, stencil printers in accordance with embodiments of the invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Referring now to the drawings, and more particularly to FIG. 1, there is generally indicated at 10 a stencil printer of an embodiment of the invention. As shown, the stencil printer 10 includes a frame 12 that supports components of the stencil printer. The components, in part, may include a controller 14, a stencil 16, and a print head 18 having a dispenser from which solder paste may be dispensed. Each of these components may be suitably coupled to the frame 12. In one embodiment, the print head 18 is on a print head gantry 20, which enables the print head to be moved in the x-axis, y-axis and z-axis directions under the control of the controller 14. As described below in further detail, the print head 18 may be placed over the stencil 16 and moved across the stencil to allow printing of solder paste onto a circuit board.

Stencil printer 10 may also include a conveyor system having rails 22, 24 for transporting a circuit board 26 to a print position in the stencil printer. The stencil printer 10 has an assembly, generally indicated at 28, for supporting the printed circuit board 26 (or "substrate"), which, as will be described in greater detail below, raises and secures the printed circuit board so that it is stable during a print operation. The substrate support assembly 28 may further include a substrate support system 30 (see FIG. 3), e.g., a plurality of pins or flexible tooling, positioned beneath the circuit board 26 when the circuit board is in the print position. The substrate support system 30 may be used, in part, to support the interior regions of the circuit board 26 to prevent flexing or warping of the circuit board during the print operation.

The print head 18 may be configured to receive at least one solder paste cartridge 32 that provides solder paste to the print head during the print operation. Although not illustrated in FIG. 1, the solder paste cartridge 32 may be coupled to one end of a pneumatic air hose, while the other end of the pneumatic air hose may be attached to a compressor that, under the control of the controller 14, provides pressurized air to the cartridge to force solder paste out of the cartridge into the print head 18 and onto the stencil 16. Mechanical devices, such as a piston, may be used in addition to, or in place of, air pressure to force the solder paste from the cartridge 32 into the print head 18. In one embodiment, the controller 14 may be configured to use a personal computer having a Microsoft DOS or Windows XP operating system with application specific software to control the operation of the stencil printer 10. The controller 14 may be networked with a master controller that is part of a line for fabricating circuit boards.

In one configuration, the stencil printer 10 operates as follows. A circuit board 26 is loaded into the stencil printer 10 using the conveyor rails 22, 24. The support assembly 28 raises and secures the circuit board 26 to a print position. The print head 18 is then lowered in the z-axis direction until blades of the print head contact the stencil 16. The print head 18 is then moved in the y-axis direction across the stencil 16. The print head 18 deposits solder paste out of the dispenser of the print head through apertures in the stencil 16 and onto the circuit board 26. Once the print head 18 has fully traversed the stencil 16, the circuit board 26 is released, lowered back onto the conveyor rails 22, 24 and transported from the printer 10 so that a second circuit board may be loaded into the printer. To print on the second circuit board, the print head 18 is moved across the stencil 16 in the direction opposite to that used for the first circuit board. Alternatively, in another embodiment, a squeegee arm (not shown) could swing inwardly to contain the solder paste in the print head 18, and the print head can then be lifted in the z-axis direction and moved back to its original position to perform a print operation on the second circuit board using a similar direction stroke.

Still referring to FIG. 1, an imaging system of an embodiment of the invention is indicated at 34. In one embodiment, the imaging system 34 may be disposed between the stencil 16 and the support assembly 28 upon which a circuit board 26 is supported. The imaging system 34 is coupled to an imaging gantry 36, which may be part of the print head gantry 20 used to move the print head 18 or provided separately within the stencil printer. The construction of the imaging gantry 36 used to move the imaging system 34 is well known in the art of solder paste printing. The arrangement is such that the imaging system 34 may be located at any position below the stencil 16 and above the circuit board 26 (when shuttled to the support assembly 28) to capture an image of predefined areas of the circuit board or the stencil, respectively. In other embodiments, when positioning the imaging system outside the printing nest, the imaging system may be located above or below the stencil and the circuit board.

Figure 2:
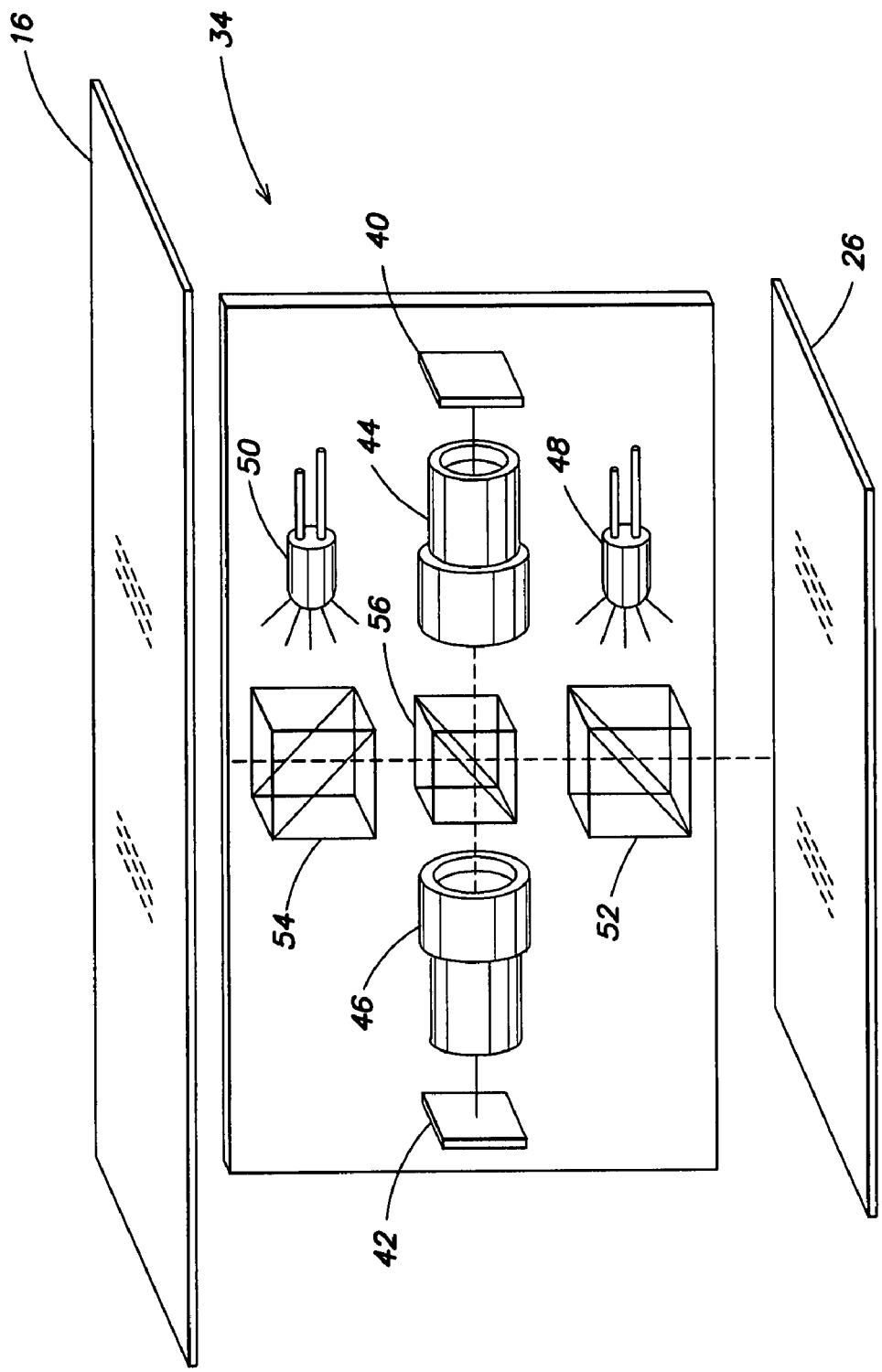
FIG. 2 is a schematic view of an imaging system of an embodiment of the invention.

As shown in FIG. 2, the imaging system 34, in a particular embodiment, comprises an optical assembly having two cameras 40, 42, two lens assemblies generally indicated at 44, 46, two illumination devices 48, 50, two beam splitters 52, 54, and a mirror 56. The cameras 40, 42 may be identical in construction with respect to one another, and, in one embodiment, each camera may be a digital CCD camera of the type that may be purchased from Opteon Corporation of Cambridge, Mass. under Model No. CHEAMDP-CACELA010100. Alternatively, one camera may be used where it has equal access to the upper and lower images and the image selection is done by the choice of one or the other illumination devices.

In one embodiment, the illumination devices 48, 50 may be one or more light emitting diodes (white light diodes) that are capable of generating an intense amount of light at their respective beam splitter. The illumination devices 48, 50 may be of the type sold by Nichia Corporation of Detroit, Mich. under Model No. NSPW310BSB1B2/ST. The beam splitters 52, 54 and the mirror 56, which is a dual mirror with zero beam split, are well known in the art. In other embodiments, xenon and halogen lamps may be used to generate the light required. Fiber optics can also be used to convey light from the remote source to the point of use.

In the shown embodiment, the beam splitters 52, 54 are designed to reflect a portion of the light generated by their respective illumination devices 48, 50 toward the circuit board 26 and the stencil 16, respectively, while further allowing a portion of the light reflected by the circuit board and the stencil pass through to the mirror 56. The optical paths defined between the illumination devices 48, 50 and their respective cameras 40, 42 by means of beam splitters 52, 54 and mirror 56 are well known to a person skilled in the art. In one embodiment, the construction of the optical paths created by the beam splitters and the mirror is similar to the paths disclosed in U.S. Pat. No. 5,060,063, entitled VIEWING AND ILLUMINATING VIDEO PROBE WITH VIEWING MEANS FOR SIMULTANEOUSLY VIEWING OBJECT AND DEVICE IMAGES ALONG VIEWING AXIS AND TRANSLATING THEM ALONG OPTICAL AXIS, except that mirror is a full mirror (due to the provision of the two cameras) and does not allow part of the light to pass therethrough.

Examples of such imaging systems may be found in U.S. patent application Ser. No. 11/272,192, entitled IMAGING SYSTEM AND METHOD FOR A STENCIL PRINTER, filed on Nov. 10, 2005, and in U.S. patent application Ser. No. 11/345,432, entitled OFF-AXIS ILLUMINATING ASSEMBLY METHOD AND SYSTEM, filed Feb. 1, 2006, which are both assigned to the assignee of the invention and incorporated herein by reference.

Figure 3:
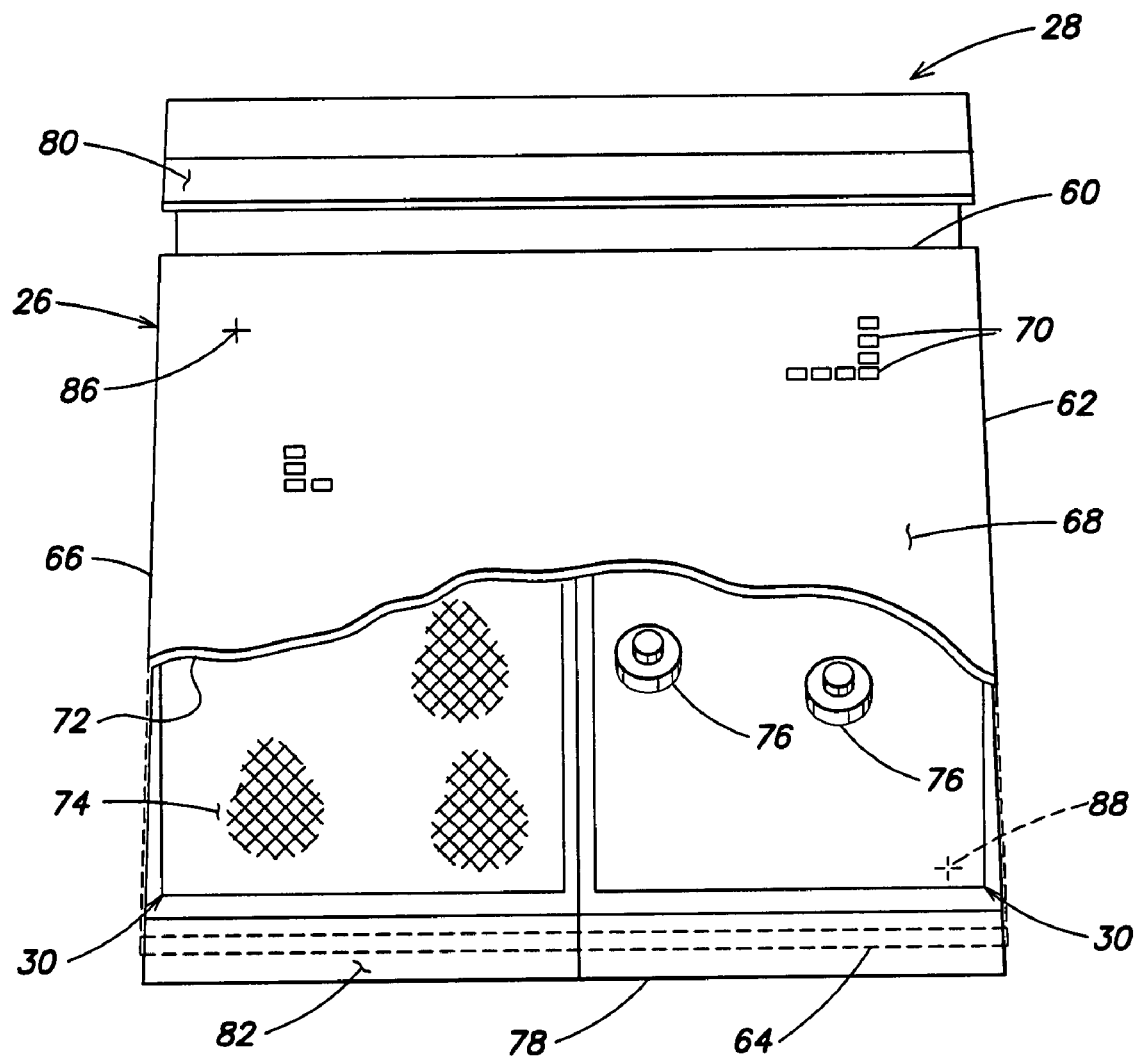
FIG. 3 shows a top perspective, schematic view of a portion of a support assembly of an embodiment of the invention with a substrate, e.g., a printed circuit board, illustrated in a lowered, pre-print position.

Referring to FIG. 3, the construction of the support assembly 28 in accordance with one embodiment is illustrated in greater detail. As shown, the printed circuit board 26 has a thin, rectangular body having four edges 60, 62, 64 and 66, two of which (60, 64), in certain embodiments, may be secured during a print operation. The circuit board 26 includes a top surface 68 having a plurality of pads 70, which are adapted to have solder paste deposited thereon during the print operation. An underneath or bottom surface 72 of the printed circuit board 26 is supported, in part, by the substrate support system 30, which prevents the printed circuit board from flexing or warping during the print operation. For illustration purposes only, two support systems 30 are shown in FIG. 3. On the left-hand side of FIG. 3, in a certain embodiment, a flexible support system, e.g., gel tooling 74, supports the printed circuit board 26. An example of such a support system may be found in U.S. patent application Ser. No. 10/394,814, entitled METHOD AND APPARATUS FOR SUPPORTING A SUBSTRATE, filed Mar. 21, 2003, now U.S. Pat. No. 7,028,391, which is owned by the assignee of the invention and incorporated herein by reference. The flexible support system 74 may be adapted to conform to the bottom surface 72 of the printed circuit board 26 to support the circuit board in a uniform manner.

On the right-hand side of FIG. 3, in another embodiment, the support system 30 comprises a plurality of pins, each indicated at 76, for supporting the printed circuit board 26, which are well-known in the art of stencil printers, and, to a lesser extent, in the art of dispensers. In a typical embodiment, a single support system is used to support the underneath of the entire circuit board.

In one embodiment, circuit boards are transported into and out of the support assembly 28 by a belt transfer assembly (not shown), which is configured to support the underside of the circuit board 26 in the area of two of the edges (e.g., edges 60, 64) of the circuit board. The belt transfer assembly is part of the conveyor system described above, and cooperates with the rails 22, 24 to transfer circuit boards 26 into and out of the stencil printer 10. Specifically, the belt transfer assembly may include a belt (not shown) driven by at least one roller (also not shown). The belt transfer assembly may further be configured so that an edge of the circuit board rides on top of the belt.

In a certain embodiment, a lift mechanism, which will be described in greater detail below, may be provided to raise the board support 30 and the circuit board 26 from a pre-print position to a raised, print position. Specifically, a table 78, mechanically coupled to the frame 12, may be raised to lift the printed circuit board 26 off the belt. Although not shown, the lift mechanism raises the printed circuit board in a position so that it engages or is proximate to a foil 80. In a certain embodiment, the weight of the support assembly 28 biases the table 78 in the pre-print or lowered position. The controller 14 may be configured to control the movement of the table 78 and thus the circuit board 26 between the pre-print position, in which circuit boards are shuttled into and out of the stencil printer 10 by the belt transfer assembly, and the raised and print positions, in which the stencil 16 engages the circuit board 26 to perform a print operation on the circuit board.

Examples of such a belt transfer assembly may be found in U.S. patent application Ser. No. 10/967,450, entitled METHOD AND APPARATUS FOR SUPPORTING AND CLAMPING A SUBSTRATE, filed Oct. 18, 2004, now U.S. Pat. No. 7,121,199, and in U.S. patent application Ser. No. 11/483,493, entitled METHOD AND APPARATUS FOR CLAMPING A SUBSTRATE, filed Jul. 10, 2006, both of which are assigned to the assignee of the invention and incorporated herein by reference.

Figure 4:
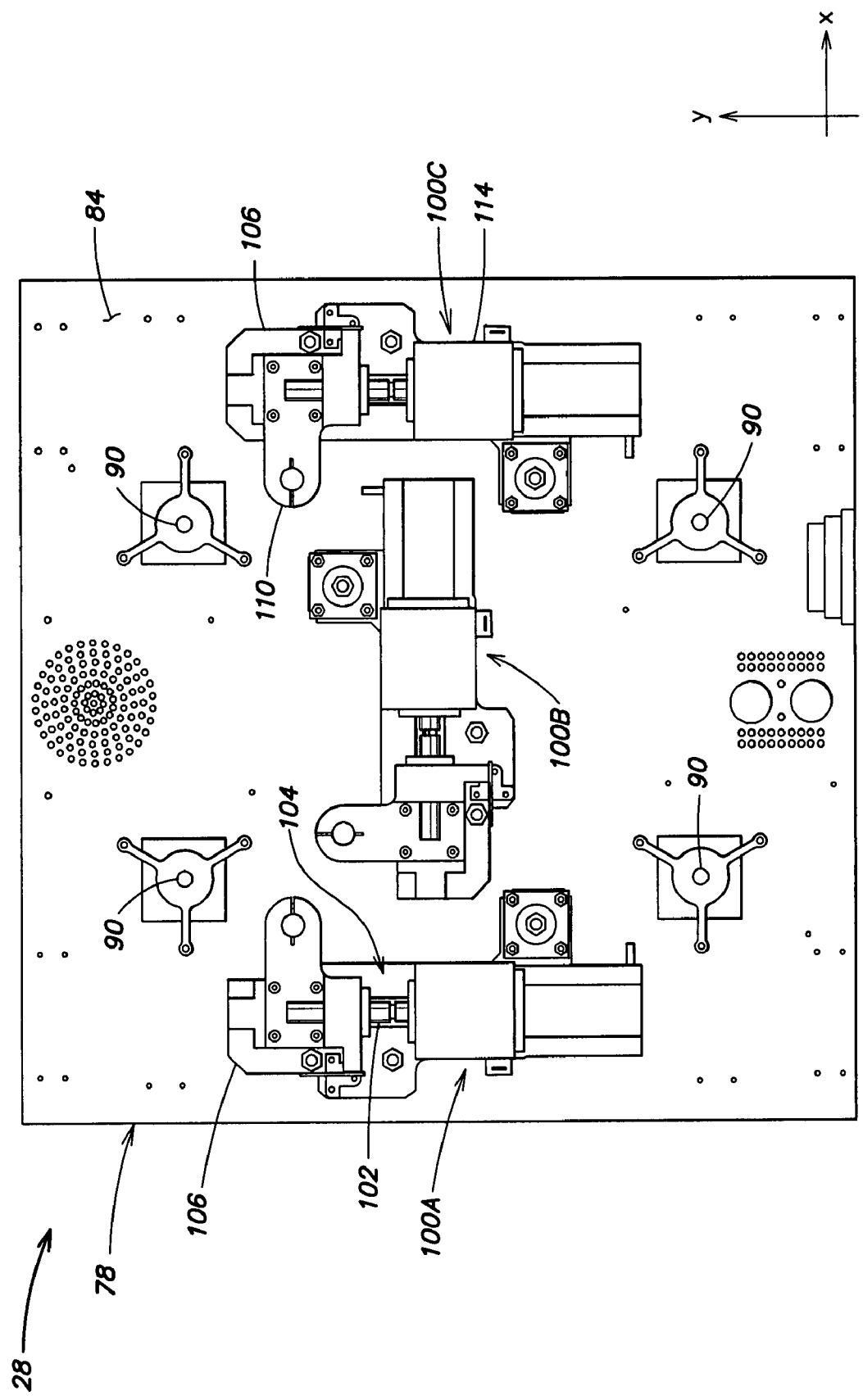
FIG. 4 shows a bottom plan schematic view of a substrate support assembly of an embodiment of the invention.

Turning now to FIG. 4, there is shown a bottom plan view of a support assembly 28 of an embodiment of the invention. As shown in FIGS. 3 and 4, the support assembly includes the table 78, which functions with the support 30 to support a circuit board 26 in a print position. The table 78 includes a top surface 82 and a bottom surface 84. The table 78 is configured to move so as to align a printed circuit board disposed on the support 30 with the stencil 16. Specifically, the imaging system 34 is configured to capture images of fiducials 86, 88 provided on the circuit board. As mentioned above, any type of reference point may be provided on the circuit board 26 to align the circuit board with the stencil 16. Based on these images, the controller 14 is configured to manipulate the table 78 by moving the table in the manner described below to align the circuit board 26 with the stencil 16. The table 78 includes four ball bearings, each indicated at 90, that are adapted to ride on top of machined surfaces 92 provided on top of the movable frame assembly 112 (see FIG. 10). As shown, the four ball bearings 90 are spaced apart to support the weight of the table 78 and the components mounted on the table. The description of the ball bearings 90 and the machined surfaces 92 will be described in detail below.

Figure 5:
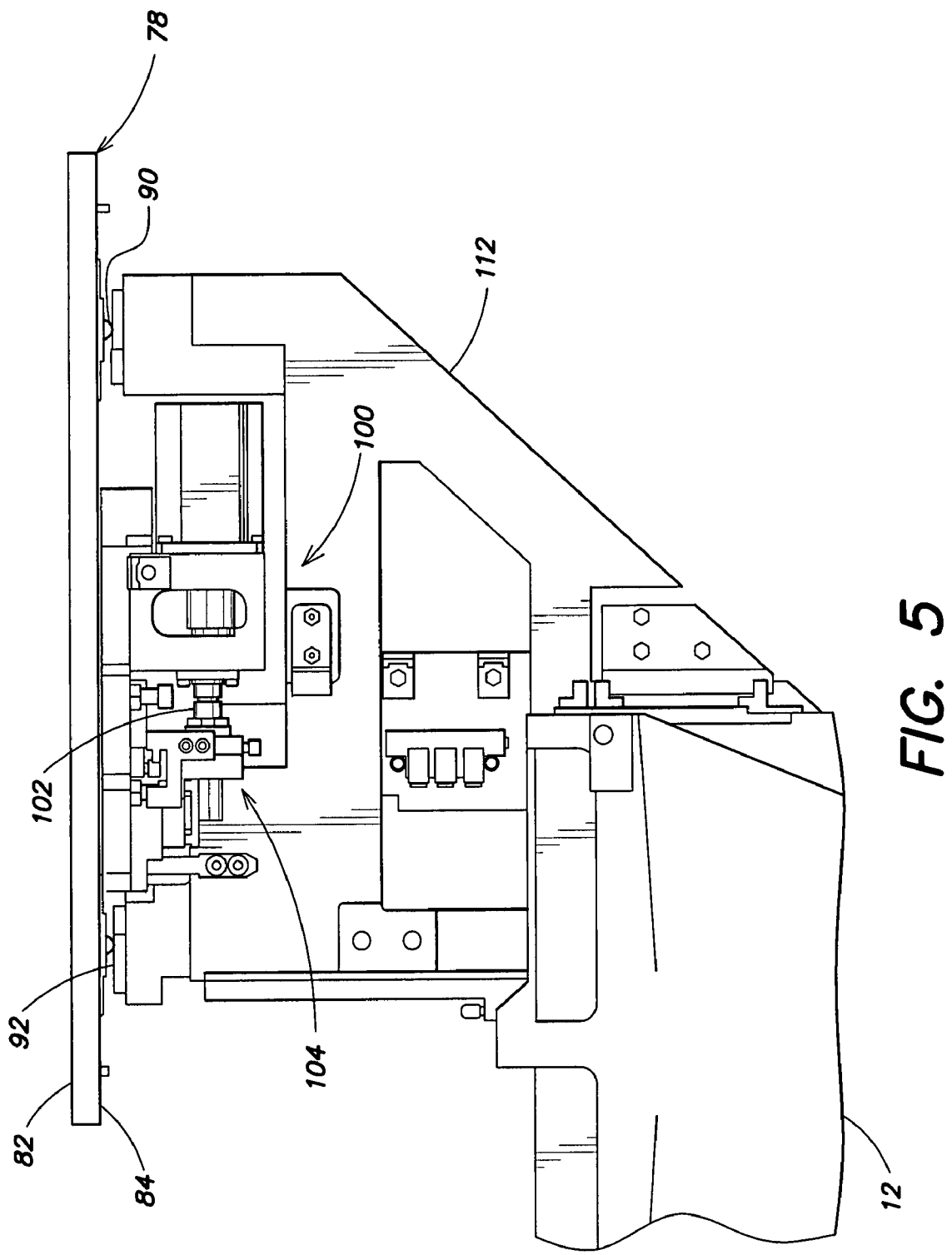
FIG. 5 shows a side elevational schematic view of the substrate support assembly shown in FIG. 4

With reference to FIGS. 4 and 5, the stencil printer 10 includes three movement mechanisms, generally indicated at 100A, 100B, 100C, to move the table 78 so that a circuit board or circuit boards are moved into alignment with the stencil 16. The movement mechanisms are identical in construction, wherein the first and third movement mechanisms 100A, 100C are configured to move the table 78 approximately in the y-axis direction and the second movement mechanism 100B is configured to move the table approximately in the x-axis direction. The movement mechanisms 100A, 100C are spaced apart from one another with the second movement mechanism 100B disposed in between in a direction transverse to the direction of the first and third mechanisms. It should be understood that a person having ordinary skill in the art, given the benefit of the teachings of this invention, may configure the movement mechanisms so that two movement mechanisms move the table 78 in the x-axis direction and one movement mechanism moves the table in the y-axis direction.

Figure 6:
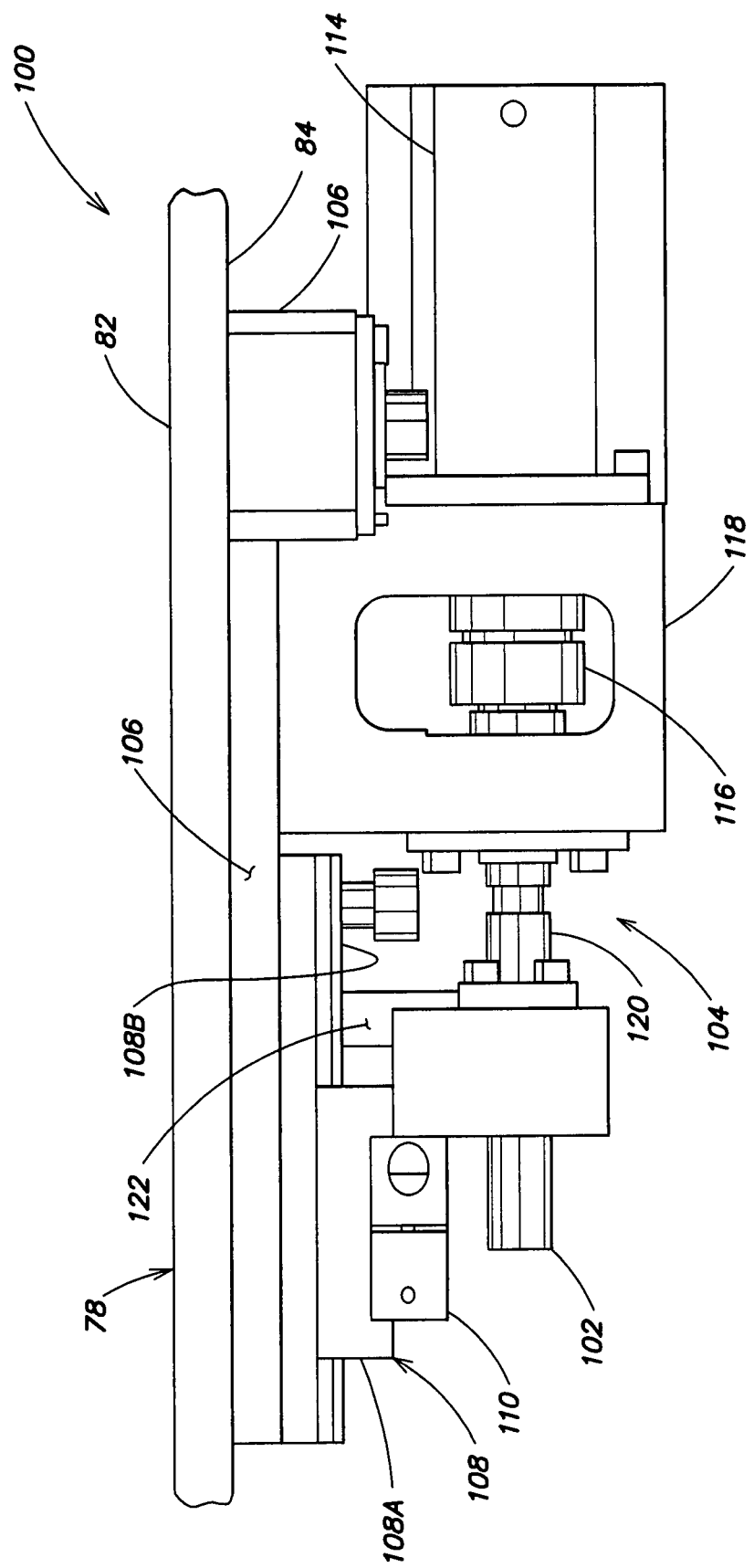
FIG. 6 shows an enlarged side elevational schematic view of a movement mechanism of the substrate support assembly shown in FIG. 5.

Referring to FIGS. 4-6, each movement mechanism 100 comprises a threaded ball screw shaft 102 and a ball screw assembly, generally indicated at 104, which rides along the ball screw shaft. The ball screw assembly 104 includes a base plate 106 that is mounted pivotally on the underside 84 of the table 78, a linear bearing 108 mounted on the base plate 106, and a clamping bracket 110 that is secured to the linear bearing and pivotably mounted to the frame 12. As shown in FIG. 6, the linear bearing 108 includes a first split portion 108A that is secured to the clamping bracket 110 and a second split portion 108B that is secured to the base plate 106. The clamping bracket 110 includes a threaded nut (not shown) configured to receive the ball screw shaft 102. As best shown in FIG. 4, the clamping bracket 110 is configured to be pivotably secured to a movable frame assembly 112 of the frame 12.

A drive 114, e.g., a stepper motor, is coupled to the ball screw shaft 102 by a coupling 116 to power the rotation of the ball screw shaft. The drive 114 is coupled to the controller 14, which, among other things, controls the operation of the drive and thus the movement of the movement mechanism 100. The ball screw shaft 102 and the drive 114 are supported by a drive block 118 having a bearing 120 adapted to receive the ball screw shaft therein. The arrangement is such that when engaging the ball screw shaft 102, the shaft rotates and thus drives the linear movement of the clamping bracket 110 along the linear bearing 108. The linear motion of the clamping bracket 110 causes the relative movement of the table 78 and the movable frame assembly 112. Thus, movement of the table 78 in the x-axis and y-axis directions, as well as the rotation of the table, is achieved under the control of the controller 14 by manipulating the movement mechanisms 100A, 100B and 100C. Each movement mechanism 100 is provided with a flag 122 to trigger an optical sensor (not shown) for limiting the movement of the table 78 when engaging the particular movement mechanism.

Figure 7:
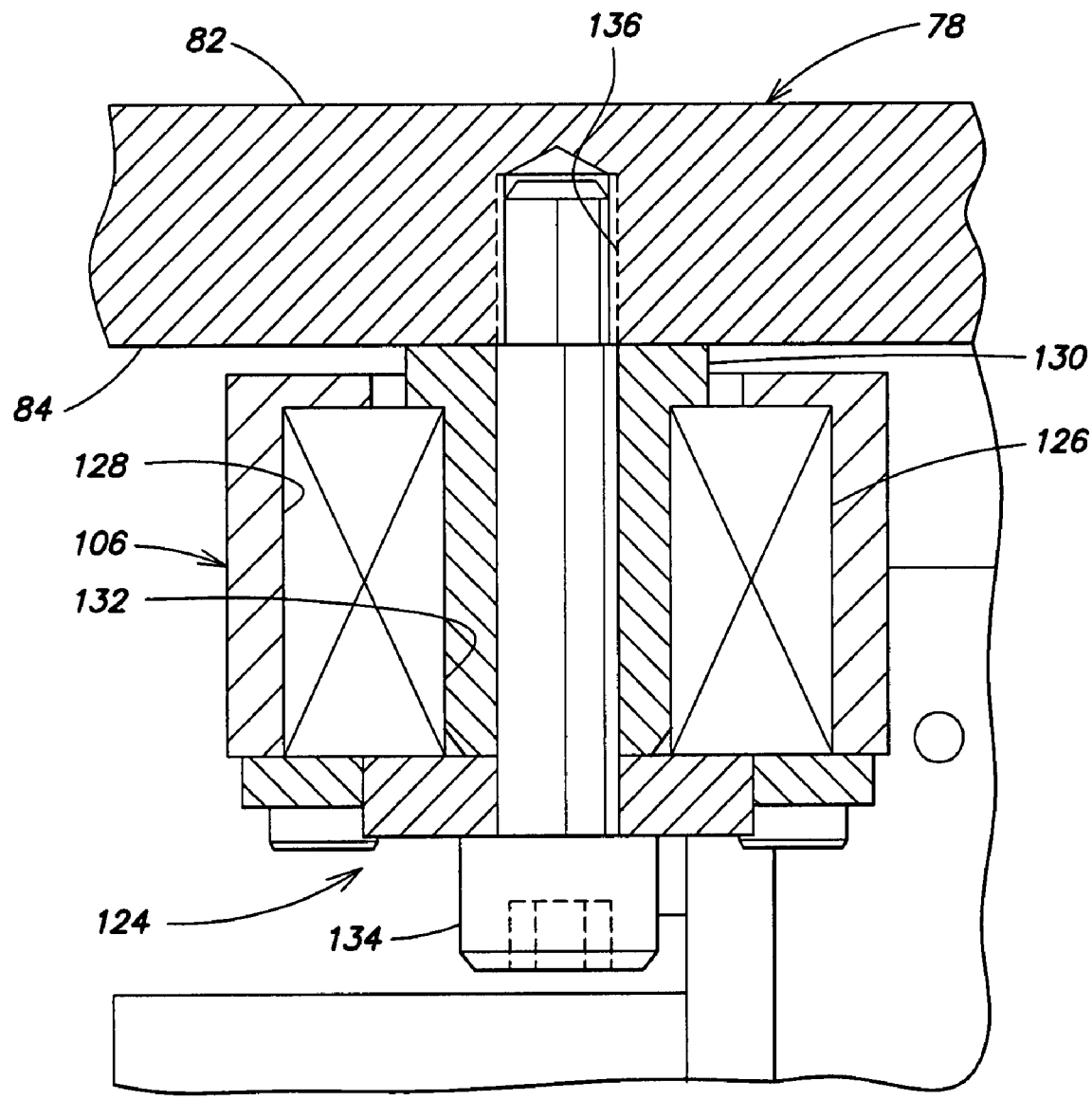
FIG. 7 shows a cross-sectional schematic view of a table connector of an embodiment of the invention.

With reference to FIG. 7, a connector, generally indicated at 124, achieves the connection of each movement mechanism 100 to the table 78. The connector 124 includes a bearing 126, such as an angular contact bearing, that is secured within an opening 128 formed in the base plate 106. The connector 124 further includes a pivot pin 130, which is received within an annular opening 132 formed in the bearing 126. These components of the connector 124 are secured to the table 78 by a bolt 134 that extends through the pivot pin 130 and is threadably secured to the bottom side 84 of the table 78 with a threaded opening formed 136 therein. The arrangement is such that the base plate 106 may pivotably move with respect to the table 78, and still move the table in a linear direction.

Figure 8:
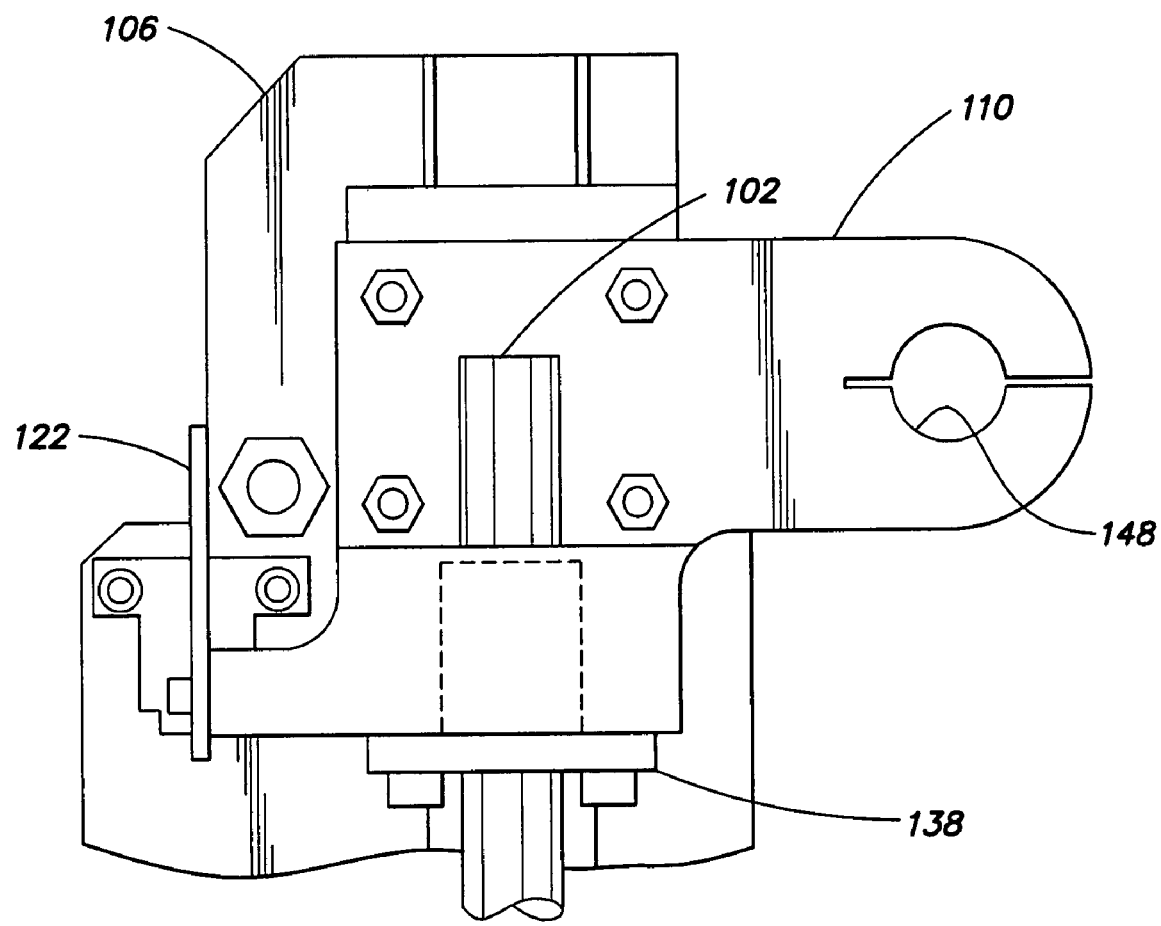
FIG. 8 shows a top, partial cross-sectional schematic
Figure 9:
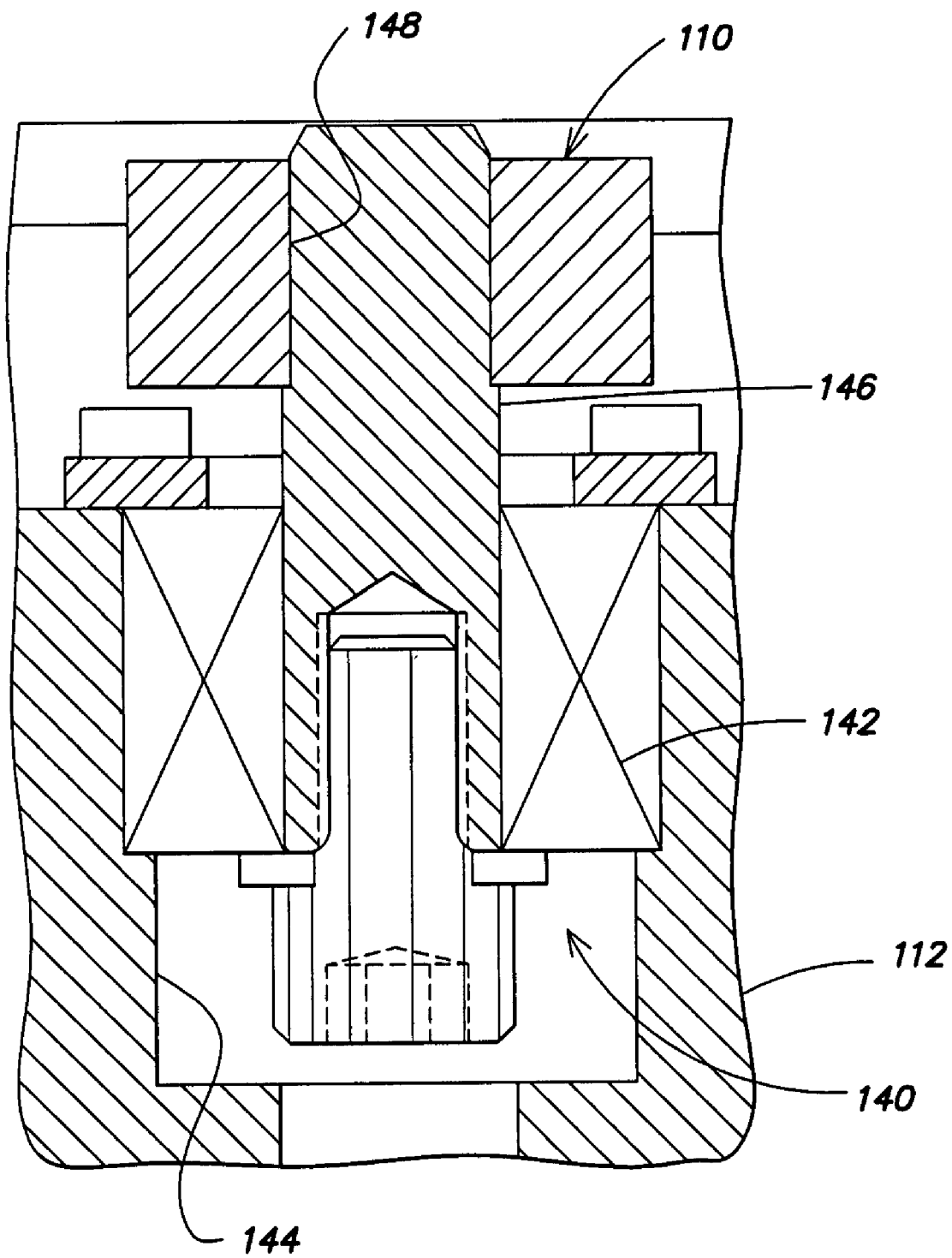
FIG. 9 shows a cross-sectional schematic view of a z-axis frame connector of an embodiment of the invention.
Figure 10:
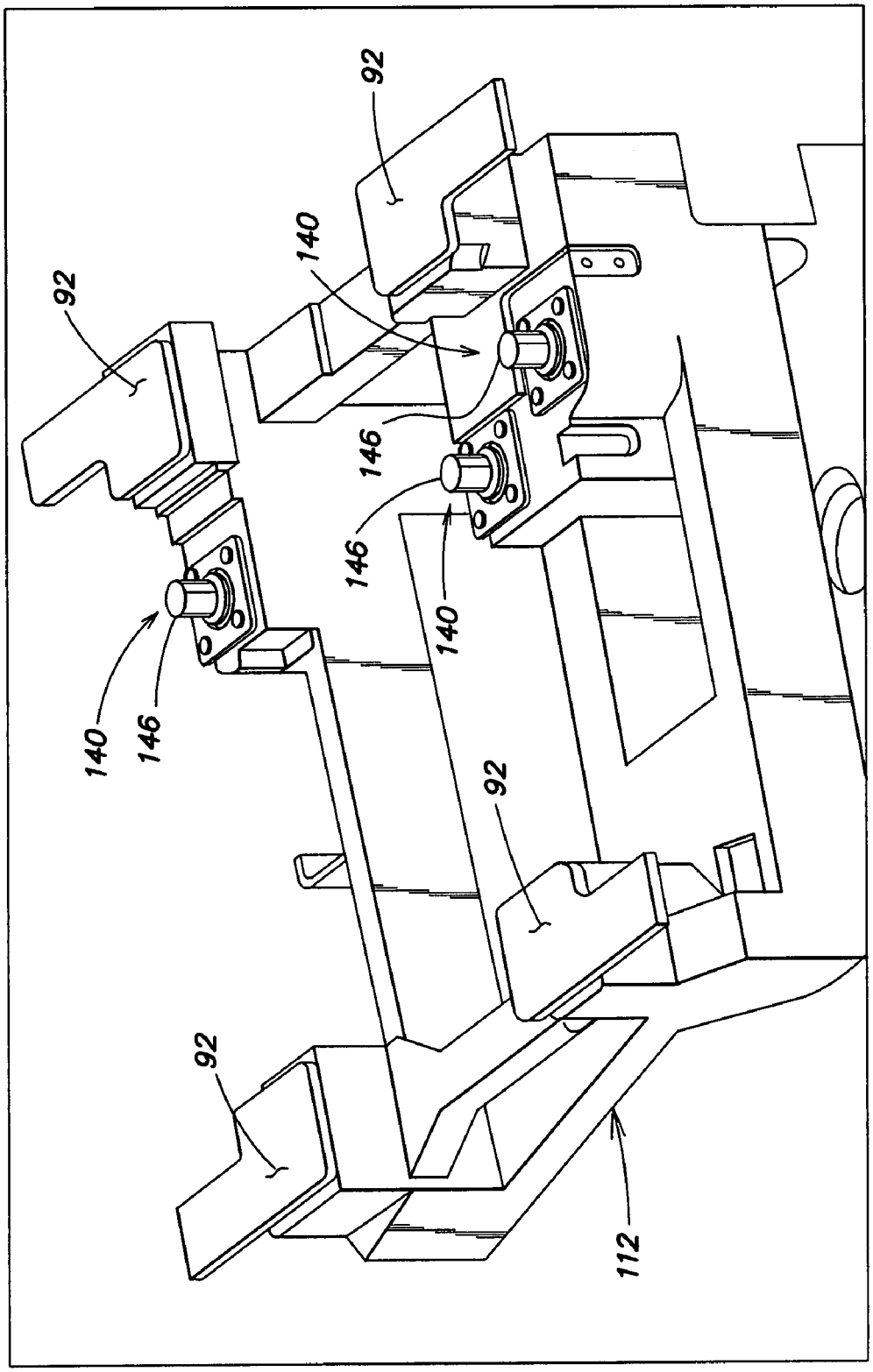
FIG. 10 shows a perspective view of a z-axis frame of an embodiment of the invention.

FIGS. 8 and 9 illustrate the connection of the movement mechanism 100 to the movable frame assembly 112. As shown in FIG. 8, the clamping bracket 110 houses a threaded ball nut 138 to receive the threaded ball screw shaft 102. The clamping bracket 110 is pivotably secured to the movable frame assembly 112 by another connector, generally indicated at 140 in FIG. 9. As shown, the connector 140 includes a bearing 142, such as an angular contact bearing, that is secured within a cavity 144 formed in the movable frame assembly 112. The connector 140 further includes a pivot pin 146, which is secured at one end thereof within an opening 148 by the clamping bracket 110. A screw fastener (not designated) may be provided to clamp the clamping bracket 110 onto the pivot pin 146. The arrangement is such that the clamping bracket 110 may pivotably move with respect to the movable frame assembly 112. FIG. 10 illustrates the pivot pins 146 of the connectors 140 secured to the movable frame assembly 112 within their respective cavities prior to their attachment to the movement mechanisms 100A, 100B and 100C.

Referring back to FIG. 5, and in addition to FIG. 10, the lift mechanism is shown to raise and lower the table (and the circuit board) between the pre-print and print positions. As shown, the movable frame assembly is movably coupled in a z-axis direction to the frame 12. Another movement mechanism (not shown), similar to movement mechanism 100, may be provided to drive the movement of the lift mechanism under the control of the controller 14. With reference to FIG. 10, the machined surfaces are shown at 92. As described above, the machined surfaces engage the bearings provided on the bottom of the table to support the table and allow the movement of the table with respect to the movable frame assembly.

Figure 11:
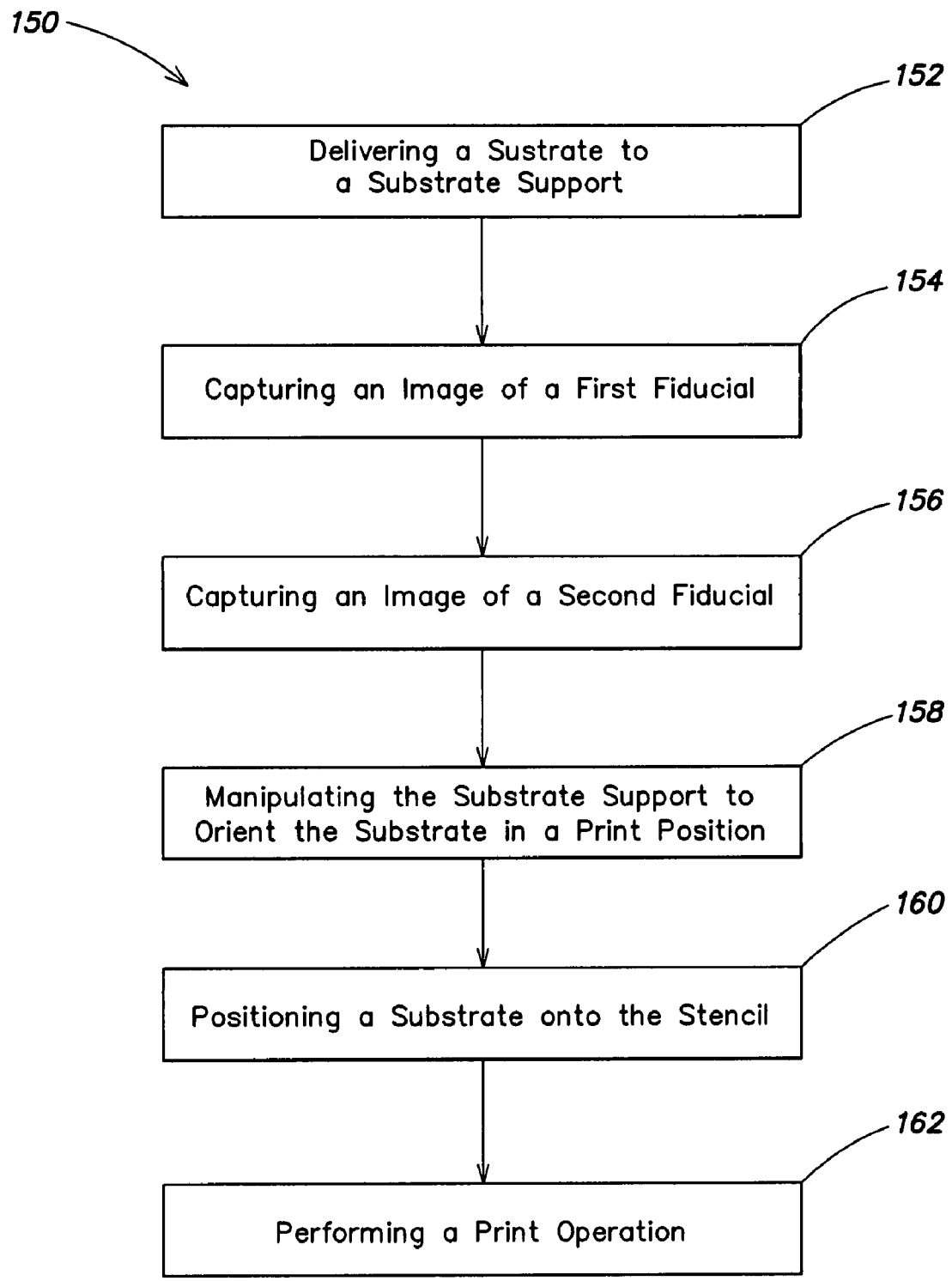
FIG. 11 shows a method of performing a print operation on an electronic substrate.
Figure 12:
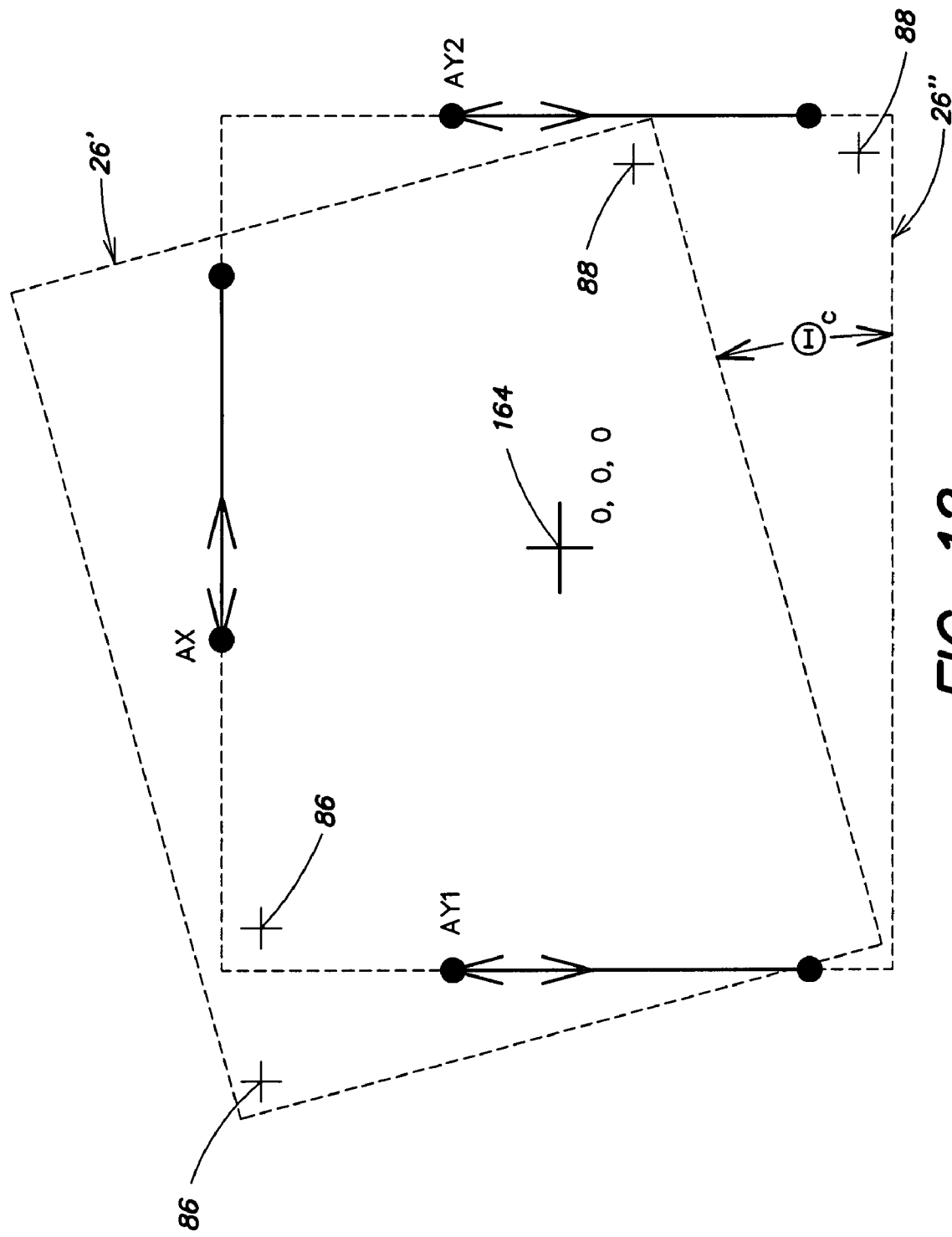
FIG. 12 shows a schematic view of an image of an electronic substrate.

With reference to FIGS. 11 and 12, FIG. 11 illustrates a method generally indicated at 150 of performing a print operation and FIG. 12 illustrates a circuit board 26' in an exaggerated skewed position and a circuit board 26" in an aligned position. During operation, at 152, a circuit board 26 is delivered to the support 30 by way of the transfer assembly. The imaging system 34 is engaged to capture an image of the first fiducial 86 at 154. Next, the imaging system 34 moves to capture an image of the second fiducial 88 at 156. The imaging system 34, in certain embodiments, may be configured to take images of the stencil 16 to further assure the alignment of the printed circuit board 26 with the stencil. Next, at 158, the table 78 (and the support 30 and circuit board 26) is manipulated to orient the circuit board 26 in an aligned print position. The circuit board 26 is then positioned to engage the stencil 16 by raising the table via the lift mechanism at 160. And finally, the stencil printer 10 is operated to perform a print position at 162.

To manipulate the table (step 158), the controller 14 may be configured to employ an algorithm to determine the amount of movement required by each movement mechanism 100 to align the stencil 16 based on the images taken by the imaging system 34. With reference to FIG. 12, the amount of movement in the x-axis direction (i.e., AX in FIG. 12) and the y-axis direction (i.e., AY1 and AY2 in FIG. 12) is determined. The amount of movement may be compared with a zero-reference point, indicated at 164 in FIG. 12. To determine the amount of movement, the following equations may be employed:

$$AX = [(-ox - axf + axr^* \cos(ax\Theta + \Theta c) + Xc)^2 + (axr^* \sin(ax\Theta + \Theta c) - axh - oy + Yc)^2]^{0.5} \quad (1)$$

$$AY1 = [(ayh1 - ox + ayr1^* \cos(ay\Theta1 + \Theta c) + Xc)^2 + (ayf - oy + ayr1^* \sin(ay\Theta1 + \Theta c) + Yc)^2]^{0.5} \quad (2)$$

$$AY2 = [(-ox - ayh2 + ayr2^* \cos(ay\Theta2 + \Theta c)Xc)^2 + (ayf - oy + ayr2^* \sin(ay\Theta2 + \Theta c) + Yc)^2]^{0.5} \quad (3)$$

where
AX is the aligned position for the x-axis direction movement mechanism;
AY1 is the aligned position for the first y-axis direction movement mechanism;
AY2 is the aligned position for the second y-axis direction movement mechanism;
axf is the distance from a fixed pivot to an AX alignment pivot in a home position;
ayf is the distance from fixed pivots to AY1 and AY2 alignment pivots in a home position;
axh is the distance from an orthogonal junction to an AX alignment pivot;
ayh1 is the distance from an orthogonal junction to AY1 and AY2 alignment pivots;
ayh2 is the distance from an orthogonal junction to AY1 and AY2 alignment pivots;
ox is the x-axis offset from an origin to an orthogonal junction;
oy is the y-axis offset from an origin to an orthogonal junction;
axr is the x-axis distance from AX to a home position;
$ax\Theta$ is the angle from AX to a home position;
$\Theta c$ is the angular fiducial correction;
Xc and Yc are the x-axis and y-axis translation of table origin to correct X, Y and $\Theta$ alignment;
ayr1 is the y-axis distance from AY1 to a home position;
ayr2 is the y-axis distance from AY2 to a home position;
$ay\Theta1$ is the angle from AY1 to a home position; and
$ay\Theta2$ is the angle from AY2 to a home position.

Referring to FIG. 12, after imaging the circuit board, thereby obtaining the locations of the first fiducial 86 and the second fiducial 88, the movement mechanism 100B achieves movement of the table 78 in the x-axis direction and the movement mechanisms 100A, 100C achieve movement of the table in the y-axis and rotational directions. Specifically, to achieve movement of the table in the y-axis direction, the movement mechanisms 100A, 100C are moved in the same direction. To achieve movement of the table in the rotational direction, the movement mechanisms 100A, 100C are moved in opposite directions. After movement, the circuit board 26" is in an aligned position, e.g., aligned with the stencil 16.

As discussed above, although the support assembly 28 is illustrated within a stencil printing apparatus, the principles of the invention may be employed in other apparatus requiring the secure support of a substrate. For example, the support assembly may be employed within a dispensing unit configured to dispense small amount of viscous material on a substrate, such as a printed circuit board. The support assembly may be further employed within a pick-and-place unit configured to dispense components onto a substrate.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A stencil printer for printing viscous material on a substrate, the stencil printer comprising:
   a frame;
   a stencil coupled to the frame;
   a print head, coupled to the frame, to deposit and print viscous material over the stencil;
   a substrate support coupled to the frame to support a substrate in a print position, the substrate support including a top surface and a bottom surface;
   a substrate support movement assembly, coupled to the substrate support, comprising
      a first movement mechanism directly coupled to the frame and the bottom surface of the substrate support, the first movement mechanism being configured to move the substrate support in a first direction with respect to the frame,
      a second movement mechanism directly coupled to the frame and the bottom surface of the substrate support, the second movement mechanism being configured to move the substrate support in a second direction with respect to the frame, the second direction being generally perpendicular to the first direction, and
      a third movement mechanism, spaced from a first movement mechanism, directly coupled to the frame and the bottom surface of the substrate support, the third mechanism being configured to move the substrate in the first direction with respect to the frame; and
   a controller coupled to the substrate support movement assembly to move the substrate support by the first, second and third movement mechanisms in an x-direction, a y-direction and a rotational direction to align the substrate.

2. The stencil printer of claim 1, wherein y-direction of movement is achieved by adjusting the first and third movement mechanisms.

3. The stencil printer of claim 1, wherein x-direction of movement is achieved by adjusting the second movement mechanism.

4. The stencil printer of claim 1, wherein rotational direction of movement is achieved by adjusting at least one of the first and third movement mechanisms in opposite directions.

5. The stencil printer of claim 1, wherein each of the first, second and third movement mechanisms comprises a ball screw drive assembly having a threaded shaft and a ball screw member axially movable along a length of the threaded shaft, the ball screw member being coupled to the bottom surface of the substrate support.

6. The stencil printer of claim 5, wherein the substrate support movement assembly further comprises a drive coupled to the threaded shaft, the drive being configured to rotate the threaded shaft under the control of the controller.

7. The stencil printer of claim 5, wherein the ball screw member of the substrate support movement assembly includes a linear bearing secured to the bottom surface of the substrate support and the frame.

8. An apparatus for performing a dispense operation on a substrate, the apparatus comprising:
   a frame;
   a dispenser coupled to the frame, the dispenser being configured to dispense viscous material on the substrate;
   a substrate support, coupled to the frame, to support a substrate in a print position, the substrate support including a top surface and a bottom surface;
   a substrate support movement assembly, coupled to the substrate support, comprising
      a first movement mechanism directly coupled to the frame and the bottom surface of the substrate support, the first movement mechanism being configured to move the substrate support in a first direction,
      a second movement mechanism directly coupled to the frame and the bottom surface of the substrate support, the second movement mechanism being configured to move the substrate support in a second direction, the second direction being generally perpendicular to the first direction, and
      a third movement mechanism spaced from the first movement mechanism and directly coupled to the frame and the bottom surface of the substrate support, the third movement mechanism being configured to move the substrate support in the first direction;
   an imaging system coupled to the frame to view the substrate in the print position; and
   a controller coupled to the substrate support movement assembly and the imaging system to move the substrate support by the first, second and third movement mechanisms in an x-direction, a y-direction and a rotational direction to align the substrate.

9. The stencil printer of claim 8, wherein each of the first, second and third movement mechanisms comprises a ball screw drive assembly having a threaded shaft and a ball screw member axially movable along a length of the threaded shaft, the ball screw member being coupled to the bottom surface of the substrate support.

10. The stencil printer of claim 9, wherein the substrate support movement assembly further comprises a drive coupled to the threaded shaft, the drive being configured to rotate the threaded shaft under the control of the controller.

11. The stencil printer of claim 10, wherein the ball screw member of the substrate support movement assembly includes a linear bearing secured to the bottom surface of the substrate support and the frame.

* * * * *